US009153510B2

(12) United States Patent
Sugimoto et al.

(10) Patent No.: US 9,153,510 B2
(45) Date of Patent: Oct. 6, 2015

(54) SEMICONDUCTOR DEVICE AND METHOD OF MANUFACTURING THE SAME

(71) Applicant: KABUSHIKI KAISHA TOSHIBA, Minato-ku (JP)

(72) Inventors: Masafumi Sugimoto, Kanagawa (JP); Eiichi Hosomi, Kanagawa (JP); Atsushi Murakawa, Kanagawa (JP); Kazumi Takahashi, Kanagawa (JP); Kazuhito Higuchi, Kanagawa (JP); Susumu Obata, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/024,212

(22) Filed: Sep. 11, 2013

(65) Prior Publication Data
US 2014/0353810 A1  Dec. 4, 2014

Related U.S. Application Data

(60) Provisional application No. 61/827,960, filed on May 28, 2013.

(51) Int. Cl.
H01L 21/50 (2006.01)
H01L 23/06 (2006.01)
H01L 21/52 (2006.01)
H01L 23/48 (2006.01)
H01L 23/00 (2006.01)
H01L 23/04 (2006.01)
H01L 23/552 (2006.01)
H01L 21/56 (2006.01)

(52) U.S. Cl.
CPC ............ *H01L 23/06* (2013.01); *H01L 21/50* (2013.01); *H01L 21/52* (2013.01); *H01L 23/04* (2013.01); *H01L 23/481* (2013.01); *H01L 23/552* (2013.01); *H01L 24/80* (2013.01); *H01L 21/561* (2013.01)

(58) Field of Classification Search
CPC ... H01L 23/481; H01L 23/10; H01L 23/5225; H01L 24/80–24/81; H01L 24/85; H01L 21/52
USPC .......... 257/774, 773, 780–781, 784, 684, 672
See application file for complete search history.

(56) References Cited

U.S. PATENT DOCUMENTS 8,659,019 B2 * 2/2014 Shizuno ........................ 257/49

FOREIGN PATENT DOCUMENTS

JP   2008-060135 A   3/2008
JP   2011-095010 A   5/2011
JP   2011-243363 A   12/2011

* cited by examiner

*Primary Examiner* — Hoa B Trinh
(74) *Attorney, Agent, or Firm* — White & Case LLP

(57) ABSTRACT

A semiconductor device includes a semiconductor substrate provided with a predetermined element and having wirings formed on its main surface connected to back wirings by a plurality of through silicon vias (TSVs), and a conductive cover which covers the main surface of the semiconductor substrate. The semiconductor substrate and the conductive cover are bonded to each other with a conductive bonding member. The TSV bonded to the conductive cover with the conductive bonding member is connected to an external electrode pad to which a ground potential is supplied.

14 Claims, 5 Drawing Sheets

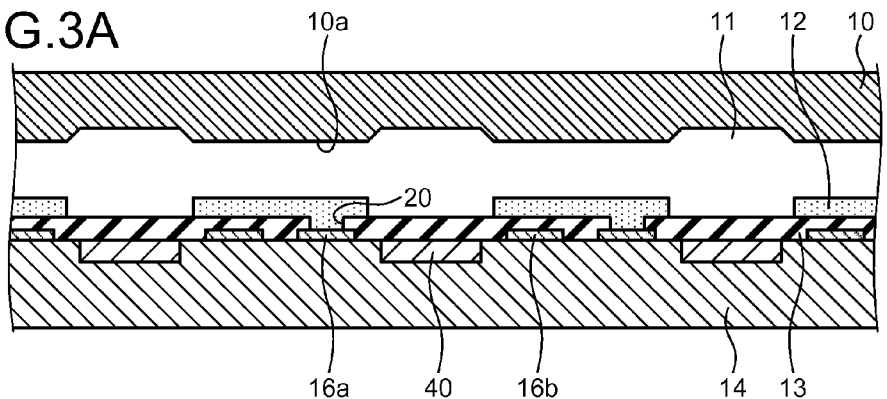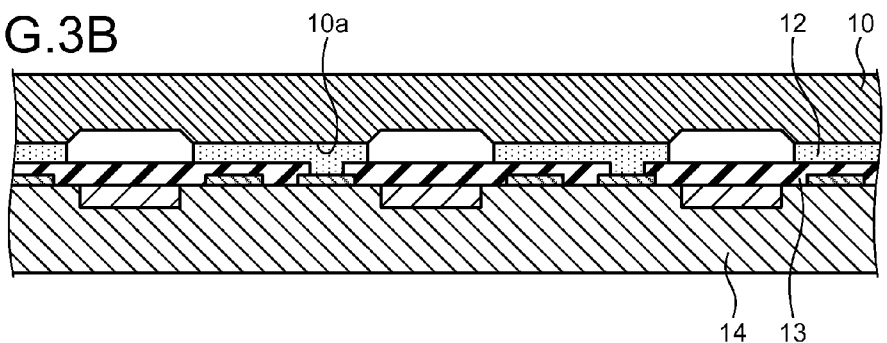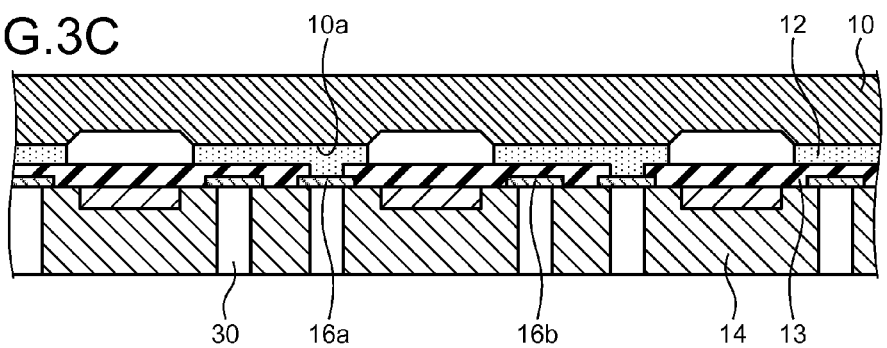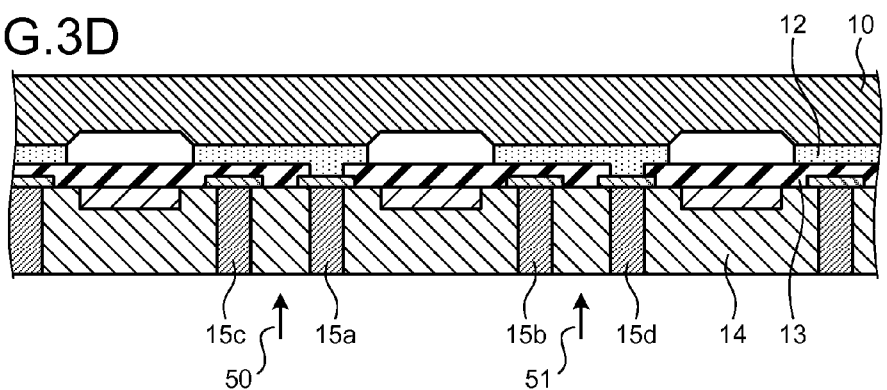

SEMICONDUCTOR DEVICE AND METHOD OF MANUFACTURING THE SAME

CROSS-REFERENCE TO RELATED APPLICATIONS

This application is based upon and claims the benefit of priority from U.S. Provisional Application No. 61/827,960, filed on May 28, 2013; the entire contents of which are incorporated herein by reference.

FIELD

Embodiments described herein relate to a semiconductor device using a wafer level packaging technology, and a method of manufacturing the same.

BACKGROUND

Conventionally, the demand for size reduction of a semiconductor device has increased along with the progress in manufacturing technology of the semiconductor device. One of technologies for meeting the demand for size reduction of the semiconductor device is a wafer level packaging technology. In the wafer level packaging technology, a semiconductor substrate where semiconductor elements have been formed at a wafer level is subjected to formation of wirings and electrodes at the wafer level, and then a surface of the semiconductor substrate is sealed with a predetermined cover and cut into a chip size through dicing, thereby providing individual semiconductor devices.

In the wafer level packaging technology, wirings formed on both main surfaces of the semiconductor substrate are connected to each other by a through silicon via (TSV) with which a through hole provided for the semiconductor substrate is filled. In the formation of the through hole, pressure applied to the wiring formed on the surface of the semiconductor substrate might result in a trouble of wiring separation or breakage.

BRIEF DESCRIPTION OF THE DRAWINGS

FIGS. 3A to 3D are diagrams for partially describing an example of a method of manufacturing a semiconductor device according to the first embodiment.

DETAILED DESCRIPTION

In general, according to one embodiment, a semiconductor device includes a semiconductor substrate having a first main surface and a second main surface and including a predetermined element formed on the first main surface and a plurality of TSVs configured to electrically connect a plurality of wirings formed on the first main surface to a plurality of electrodes correspondingly formed on the second main surface. The semiconductor device also includes a conductive cover which covers the first main surface of the semiconductor substrate, and a conductive bonding member which bonds the conductive cover and one wiring of the wirings formed on the first main surface of the semiconductor substrate to each other.

Exemplary embodiments of a semiconductor device and a method of manufacturing the same will be explained below in detail with reference to the accompanying drawings. The present invention is not limited to the following embodiments.

Figure 1:
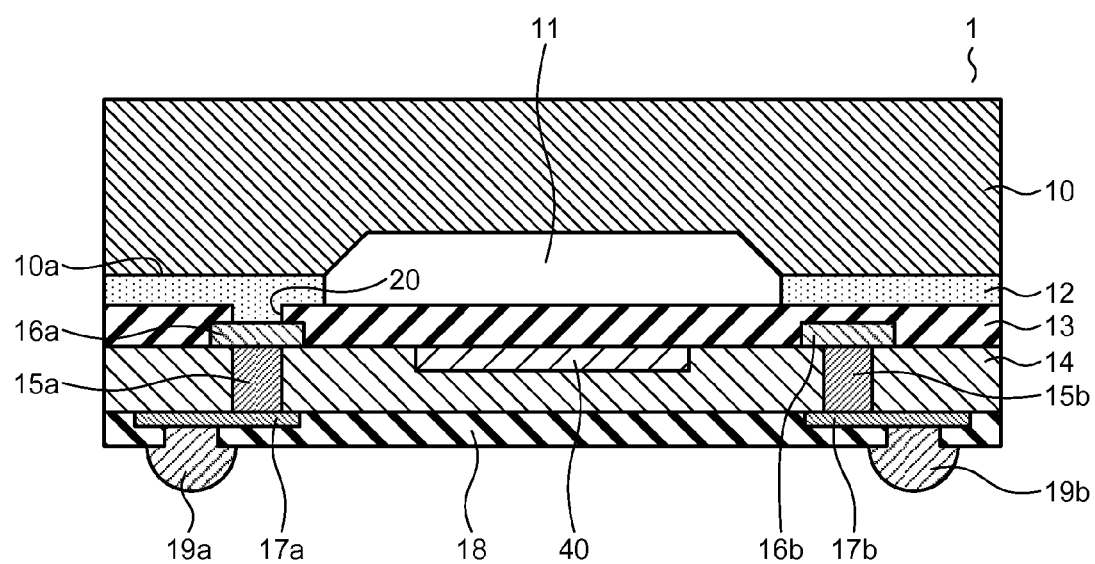
FIG. 1 is a schematic sectional view of a semiconductor device according to a first embodiment.

FIG. 1 is a schematic sectional view of a semiconductor device according to a first embodiment. A semiconductor device 1 of this embodiment includes a semiconductor substrate 14 provided with a predetermined active element 40. In-chip wirings (16a and 16b) are formed on a first main surface of the semiconductor substrate 14. The in-chip wirings (16a and 16b) are electrically connected to the active element 40, for example. The first main surface of the semiconductor substrate 14 is provided with a passivation film 13 including a silicon nitride film, for example. On a second main surface of the semiconductor substrate 14, specifically on a back surface, back wirings (17a and 17b) are formed. The in-chip wirings (16a and 16b) and the corresponding back wirings (17a and 17b) are connected to each other by TSVs (15a and 15b) provided for the semiconductor substrate 14, respectively.

A passivation film 18 is formed on the second main surface of the semiconductor substrate 14. The passivation film 18 is formed using, for example, a silicon nitride film. The back wirings (17a and 17b) are connected to solder balls (19a and 19b) via predetermined openings provided for the passivation film 18. The solder balls (19a and 19b) form external electrodes of the semiconductor device 1. A conductive bonding member 12 is formed on the first main surface side of the semiconductor substrate 14. For the conductive bonding member 12, for example, Au—Sn alloy, Ag—Sn alloy, Cu—Sn alloy, Ag paste, or the like is used. The in-chip wiring 16a is electrically connected to the conductive bonding member 12 via an opening 20 provided for the passivation film 13. To the solder ball 19a electrically connected to the conductive bonding member 12, a ground potential is applied when the semiconductor device 1 is in operation (hereinafter referred to as operation time).

The first main surface side of the semiconductor substrate 14 is covered with a conductive cover 10. As the conductive cover 10, for example, a silicon substrate doped with boron is used. The conductive cover 10 is provided with a concave portion 11 facing the first main surface side of the semiconductor substrate 14. With the thickness of the bonding member 12 and the concave portion 11 provided for the conductive cover 10, a hollow portion is formed between the semiconductor substrate 14 and the conductive cover 10. In this hollow portion, another element (not shown) can be disposed. For example, a passive element such as a coil or a capacitor, or an active element such as an Integrated Circuit (IC) chip, can be disposed. The conductive cover 10 and the semiconductor substrate 14 are bonded to each other with the conductive bonding member 12. A bonding unit 10a for forming the periphery of the concave portion 11 of the conductive cover 10 is bonded to the semiconductor substrate 14 with the bonding member 12 on the semiconductor substrate 14. Note that when another element (not shown) is disposed in the hollow portion, the element can be electrically connected to the solder balls (19a and 19b) serving as the external electrodes or to the active element 40, using the in-chip wirings (16a and 16b) formed on the first main surface of the semiconductor substrate 14.

In the first embodiment, the conductive cover 10 covering the first main surface of the semiconductor substrate 14 is conductive. This conductive cover 10 is connected to the solder ball 19a via the TSV provided for the semiconductor substrate 14. A ground potential is supplied to the solder ball 19a during the operation time. With this configuration, the conductive cover 10 exhibits an electromagnetic shielding effect, thereby reducing the influence of electromagnetic radiation on the active element 40 formed on the semiconductor substrate 14. The bonding member 12 has the function of the bonding member for bonding the semiconductor substrate 14 and the conductive cover 10, and at the same time, has the function as a part of the wiring ranging from the solder ball 19a to the conductive cover 10. The conductive bonding member 12, to which the ground potential is applied, also exhibits the electromagnetic shielding effect.

The bonding member 12 exists between the conductive cover 10 and the in-chip wirings (16a and 16b) formed on the first main surface of the semiconductor substrate 14. In other words, no space is formed between the conductive cover 10 and the in-chip wirings (16a and 16b) of the semiconductor substrate 14 positioned on the TSVs (15a and 15b). Thus, even though pressure is applied on the in-chip wirings (16a and 16b) during the formation of the through holes for forming the TSVs (15a and 15b) through the semiconductor substrate 14, the in-chip wirings (16a and 16b) are prevented from being separated or broken. Specific description of the manufacturing method is made later. According to this embodiment, a semiconductor device with the electromagnetic shielding effect and high reliability due to the manufacturing process can be provided.

Figure 2A:
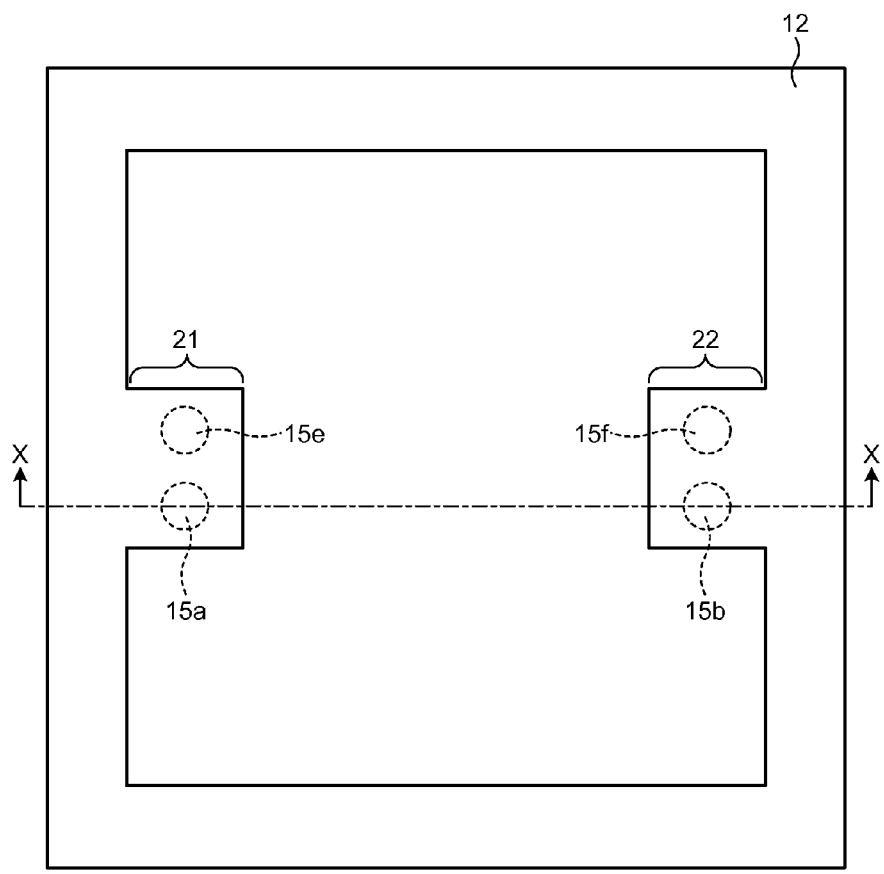
FIGS. 2A and 2B are diagrams for describing a positional relation between TSVs and a bonding member for bonding a semiconductor substrate and a conductive cover.
Figure 2B:
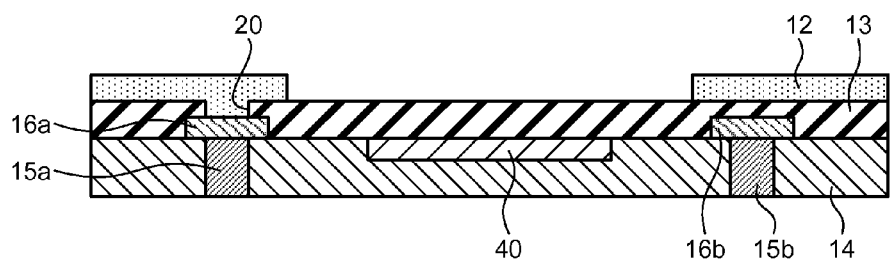

FIGS. 2A and 2B are diagrams for describing the positional relation between the TSVs and the conductive bonding member for bonding the semiconductor substrate and the conductive cover. As one example, the case where four TSVs (15a, 15b, 15e, and 15f) are provided for the semiconductor substrate 14 is described. FIG. 2A is a plan view of the pattern shape of the conductive bonding member 12 provided on the first main surface of the semiconductor substrate 14. FIG. 2B schematically illustrates a part of the semiconductor device 1 along an alternate long and short dash line X-X of FIG. 2A. The conductive cover 10 covering the semiconductor substrate 14, the back wiring of the semiconductor substrate 14, and the like are omitted.

As illustrated in FIG. 2A, the conductive bonding member 12 has a projection portion 21 and a projection portion 22, which project inward from the periphery. The projection portion 21 is disposed extending over the two TSVs (15a and 15e). The projection portion 22 is disposed extending over the two TSVs (15b and 15f). Therefore, the bonding member 12 is disposed on the first main surface side of the semiconductor substrate 14 corresponding to the positions of all the TSVs (15a, 15b, 15e, and 15f) provided for the semiconductor substrate 14, and the bonding member 12 and the conductive cover 10 are bonded to each other. The in-chip wiring 16a as one of the in-chip wirings formed on the first main surface of the semiconductor substrate 14 is electrically connected to the conductive bonding member 12 via the opening 20 provided for the passivation film 13.

A part of the conductive bonding member 12, which is disposed over the TSVs, is wide and has the projection portions (21 and 22) and the other part is narrow. The conductive bonding member 12 is expensive because Au—Sn alloy, Ag—Sn alloy, Cu—Sn alloy, Ag paste, or the like is used. The periphery of the conductive bonding member 12 has constant width and only a part thereof which is located on the TSVs (15a, 15b, 15e, and 15f) is wide, so that the amount of the bonding member 12 used can be reduced. This leads to the cost reduction of the manufacture of the semiconductor device. Note that the shape of the bonding unit 10a where the conductive cover 10 abuts on the bonding member 12 can be made fit to the shape of the bonding member 12 as illustrated in FIG. 2A. By decreasing the width of the bonding unit 10a of the conductive cover 10 at other than the position corresponding to the projection portions (21 and 22) of the bonding member 12, the concave portion 11 of the conductive cover 10 can be made larger. This can enlarge the hollow portion formed between the semiconductor substrate 14 and the conductive cover 10. This is convenient when another element (not shown) is mounted inside the semiconductor device 1.

FIG. 3A to FIG. 3D are sectional views for partially describing an example of a method of manufacturing the semiconductor device according to the first embodiment. First, as illustrated in FIG. 3A, the semiconductor substrate 14 provided with the predetermined active element 40 is formed. The first main surface of the semiconductor substrate 14 has the in-chip wirings (16a and 16b) formed thereon. The in-chip wirings (16a and 16b) have predetermined connection with the active element 40 provided for the semiconductor substrate 14. For example, as the in-chip wirings (16a and 16b), an aluminum wiring on which predetermined patterning has been performed is used. The first main surface of the semiconductor substrate 14 has the passivation film 13 including, for example, silicon nitride formed thereon. On the passivation film 13, the conductive bonding member 12 on which predetermined patterning has been performed is formed. For the conductive bonding member 12, for example, Au—Sn alloy, Ag—Sn alloy, Cu—Sn alloy, Ag paste, or the like is used. The particular in-chip wiring 16a among the in-chip wirings is electrically connected to the conductive bonding member 12 via the opening 20 provided for the passivation film 13. The conductive cover 10 having the predetermined concave portion 11 is prepared. As the conductive cover 10, a silicon substrate doped with a predetermined impurity such as boron is used. The concave portion 11 is formed by performing a predetermined etching step on the silicon substrate.

Next, the conductive cover 10 and the semiconductor substrate 14 are bonded to each other with the bonding member 12 through thermal treatment (FIG. 3B).

Next, the second surface side of the semiconductor substrate 14, specifically, the back side thereof is ground in a back grinding step, thereby thinning the semiconductor substrate 14. Subsequently, through holes 30 are formed from the back side of the semiconductor substrate 14 toward the in-chip wirings (16a and 16b) formed on the first main surface side (FIG. 3C). For example, RIE (Reactive Ion Etching) is employed. After that, the inside of the through holes 30 is washed with pure water, for example.

Next, the TSVs (15a, 15b, 15c, and 15d) are formed through the through holes 30 (FIG. 3D). For forming the TSVs (15a, 15b, 15c, and 15d), first, a protective film (not shown) including silicon oxide is formed using CVD (Chemical Vapor Deposition) on the back surface of the semiconductor substrate 14. Then, the protective film at the bottom of the through hole 30, specifically, on the surface of the in-chip wirings (16a and 16b) on the through hole side is selectively removed by RIE. Next, a seed layer (not shown) including Cu, for example, is formed on the entire back surface of the semiconductor substrate 14 by sputtering. A resist film (not shown) is formed on the seed layer and a predetermined patterning step is performed, thereby forming openings (not shown) corresponding to the through holes 30. Subsequently, a Cu plating step is performed to fill the through holes 30 with Cu, thereby forming the TSVs (15a, 15b, 15c, and 15d). Note that as for the filling of the through holes 30 with Cu, the through holes 30 are not necessarily filled completely. The TSVs (15a, 15b, 15c, and 15d) may merely fulfill the function of electrically connecting the in-chip wirings (16a and 16b) formed on the first main surface side of the semiconductor substrate 14 to the back wirings formed on the second main surface side. Even though the incomplete filling of the through hole 30 with the TSV generates the space inside the through hole 30, the space can be filled by a subsequently performed wiring step on the second main surface side of the semiconductor substrate 14 or by the predetermined passivation film formed on the second main surface side of the semiconductor substrate 14. Subsequently, the resist layer is separated and the Cu seed layer is selectively removed by etching.

Subsequently, the wiring step is performed on the second main surface side, specifically, the back side of the semiconductor substrate 14. For example, the wiring step on the back side is performed as below. For example, a back wiring (not shown) including aluminum to be connected to the TSV is formed on the back side of the semiconductor substrate 14 in a photolithography step and an etching step. Subsequently, a passivation film (not shown) including, for example, silicon nitride is formed on the second main surface of the semiconductor substrate 14. The passivation film is subjected to predetermined patterning, thereby forming a predetermined opening (not shown) for exposing a part of a surface of the back wiring. A solder is mounted on the predetermined opening provided for the passivation film, and a reflow step is performed to form a solder ball (not shown). Note that the back wiring may be formed by extending a Cu layer, which forms the TSV, onto the second main surface of the semiconductor substrate 14. Finally, a dicing step is performed to divide the substrate into individual semiconductor devices. The dicing is performed at positions indicated by arrows (50 and 51) in FIG. 3D.

As thus described, the passivation film 13, the bonding member 12, and the conductive cover 10 are formed over the in-chip wirings (16a and 16b) having the through holes 30. In other words, no space is formed between the in-chip wirings (16a and 16b) and the conductive cover 10. Therefore, it is possible to prevent the in-chip wirings (16a and 16b) from being separated or broken by pressure applied in a washing step or the like when the through holes 30 are formed through the semiconductor substrate 14.

Figure 4A:
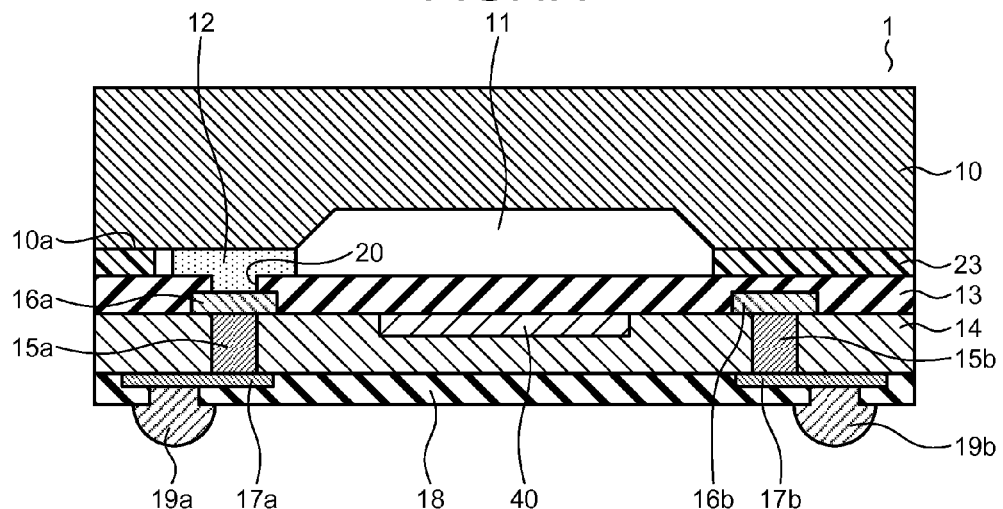
FIGS. 4A and 4B are a schematic sectional view of a semiconductor device according to a second embodiment and a diagram for describing a positional relation between the bonding member and the TSVs.
Figure 4B:
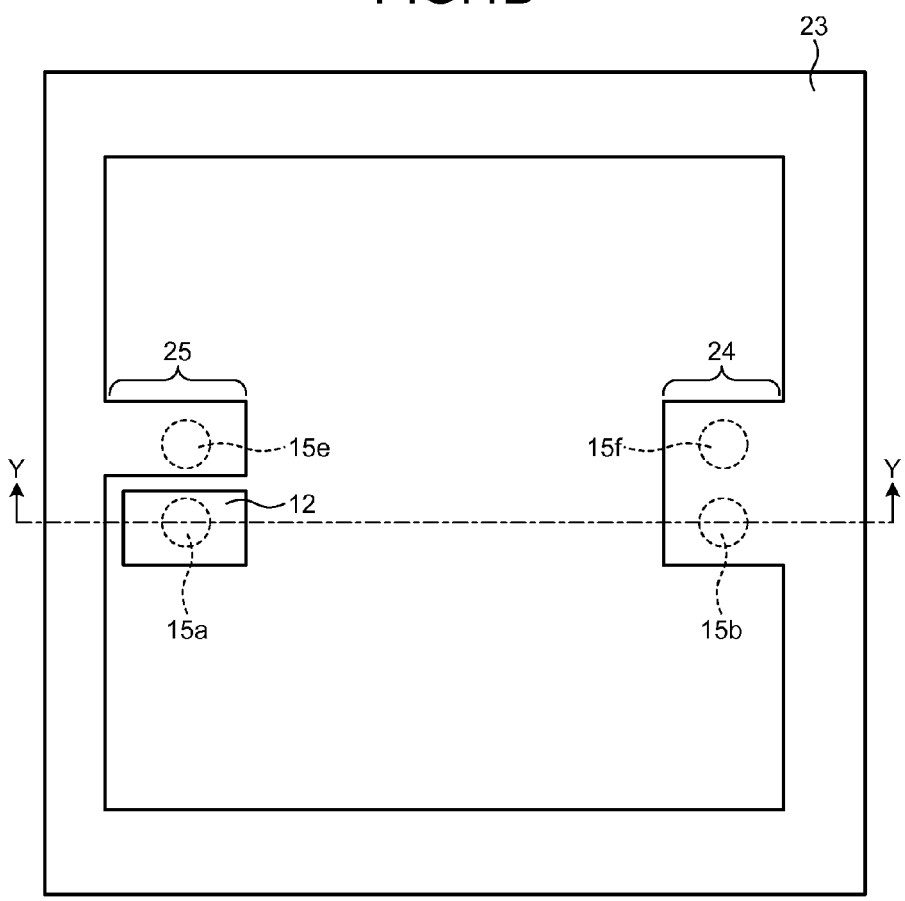

FIGS. 4A and 4B are a schematic sectional view of the semiconductor device according to a second embodiment, and a diagram for describing the positional relation between the bonding member and the TSVs. The components corresponding to those in the above embodiment are denoted with the same reference symbols, and the description is omitted. FIG. 4A is a schematic sectional view of the semiconductor device 1. FIG. 4B is a plan view of the pattern shape of bonding members (12 and 23) provided on the main surface of the semiconductor substrate 14. FIG. 4A schematically illustrates the sectional structure of the semiconductor device 1 along an alternate long and short dash line Y-Y of FIG. 4B.

In this embodiment, except a part, the bonding member for bonding the conductive cover 10 and the semiconductor substrate 14 is constituted by an insulating bonding member 23. As illustrated in FIG. 4B, the insulating bonding member 23 includes a projection portion 24 and a projection portion 25 projecting inward from the periphery. The projection portion 24 is disposed extending over the TSVs (15b and 15f). The projection portion 25 is disposed extending over the TSV 15e. The conductive bonding member 12 is disposed on the in-chip wiring 16a electrically connected to the solder ball 19a to which the ground potential is applied during the operation time. The in-chip wiring 16a is bonded to the conductive cover 10 with the conductive bonding member 12. For the conductive bonding member 12, for example, Au—Sn alloy, Ag—Sn alloy, Cu—Sn alloy, Ag paste, or the like is used. For the insulating bonding member 23, a photosensitive adhesive resin is used, for example. The photosensitive adhesive resin is formed on the passivation film 13 and predetermined patterning is performed, thereby providing the bonding member 23.

In this embodiment, the conductive bonding member 12 is provided just on the TSV 15a connected to the solder ball 19a to which the ground potential is applied during the operation time. The ground potential applied to the solder ball 19a is supplied to the conductive cover 10 via the TSV 15a, the in-chip wiring 16a, and moreover the conductive bonding member 12. With this configuration, the conductive cover 10 exhibits the electromagnetic shielding effect. Over the other TSVs (15e and 15f) including the TSV 15b, the projection portion 24 and the projection portion 25 of the insulating bonding member 23 extending inward from the periphery are provided. In this embodiment, the conductive cover 10 and the semiconductor substrate 14 are bonded to each other mainly with the insulating bonding member 23 provided for the periphery of the semiconductor substrate 14. The amount of usage of the conductive bonding member 12 containing a noble metal such as Au or Ag can be reduced, thereby reducing the manufacturing cost of the semiconductor device. Moreover, since the conductive bonding member 12 is not exposed during the dicing, the outflow of the bonding member 12 can be prevented.

Figure 5A:
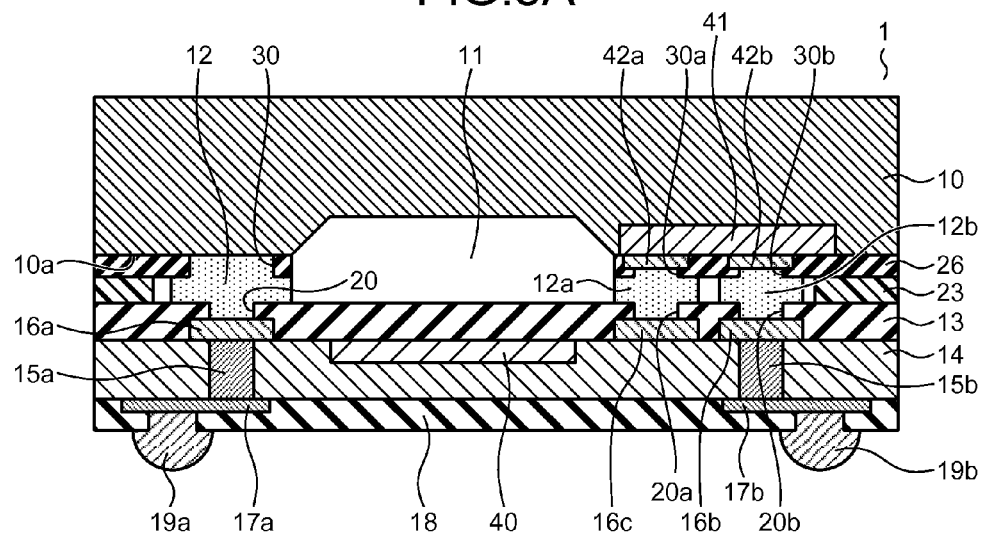
FIGS. 5A and 5B are a schematic sectional view of a semiconductor device according to a third embodiment and a diagram for describing a positional relation between the bonding member and the TSVs.
Figure 5B:
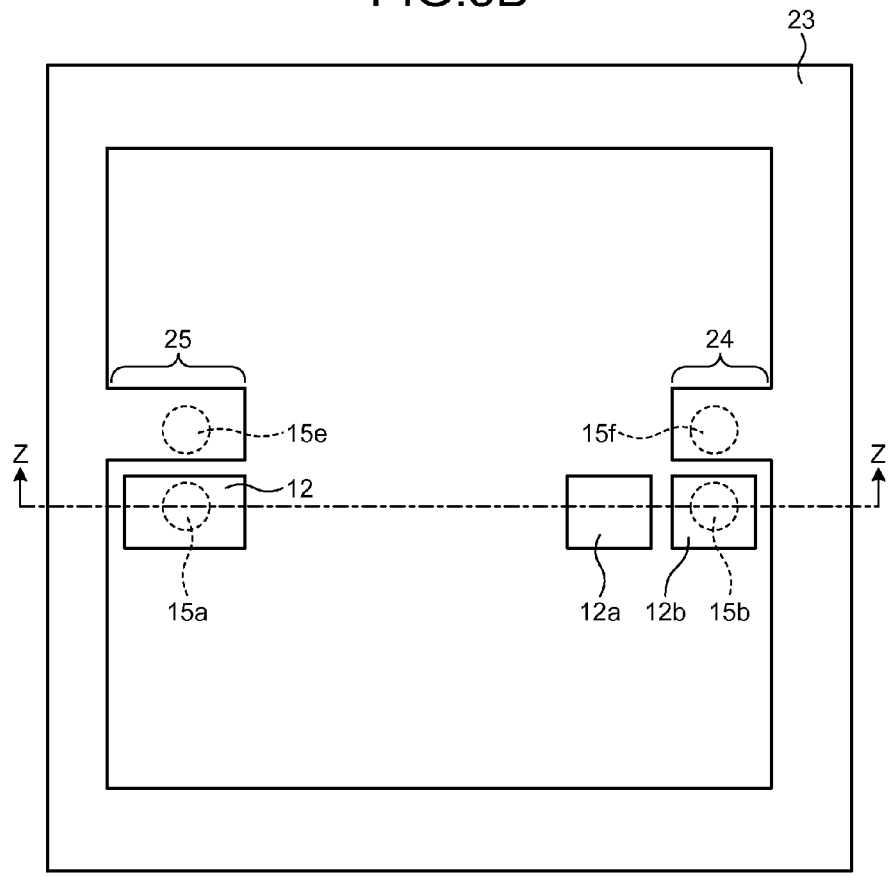

FIGS. 5A and 5B are a schematic sectional view of the semiconductor device according to a third embodiment, and a diagram for describing the positional relation between the bonding member and the TSVs. The components corresponding to those in the above embodiments are denoted with the same reference symbols, and the description is omitted. FIG. 5A is a schematic sectional view of the semiconductor device 1. FIG. 5B is a plan view of the pattern shape of bonding members (12, 12a, 12b, and 23) provided on the main surface of the semiconductor substrate 14. FIG. 5A schematically illustrates the sectional structure of the semiconductor device 1 along an alternate long and short dash line Z-Z of FIG. 5B.

In this embodiment, the conductive cover 10 is also provided with a predetermined active element 41. The active element 41 can be formed by introducing a predetermined impurity to the conductive cover 10 including a silicon substrate in a manner similar to the semiconductor substrate 14. On the active element 41 of the conductive cover 10, in-chip wirings (42a and 42b) are formed. Each of the in-chip wirings (42a and 42b) is electrically connected to the active element 41. The in-chip wiring 42a is electrically bonded to the conductive bonding member 12a via an opening 30a provided for a passivation film 26 including, for example, silicon nitride formed on a surface of the conductive cover 10. The conductive bonding member 12a is electrically connected to an in-chip wiring 16c on the semiconductor substrate 14 side via an opening 20a provided for the passivation film 13 on the semiconductor substrate 14. By electrically connecting the in-chip wiring 42a on the conductive cover 10 side and the in-chip wiring 16c on the semiconductor substrate 14 side to each other, signal transmission and reception are allowed between the active element 40 provided for the semiconductor substrate 14 and the active element 41 formed on the conductive cover 10 side.

The in-chip wiring 42b on the conductive cover 10 side is electrically connected to the in-chip wiring 16b on the semiconductor substrate 14 side via the conductive boding member 12b. For example, the in-chip wiring 16b on the semiconductor substrate 14 side is electrically connected to the active element 40, and moreover electrically connected to the solder ball 19b serving as the external electrode. The signals supplied to the solder ball 19b can be supplied to the active element 40 provided for the semiconductor substrate 14 and the active element 41 provided for the conductive cover 10.

The in-chip wiring 16a on the semiconductor substrate 14 side, which is electrically connected to the solder ball 19a, is bonded to the conductive bonding member 12. The conductive bonding member 12 is bonded to the conductive cover 10 via the opening 30 provided for the passivation film 26. By applying the ground potential, which is applied to the solder ball 19a during the operation time, to the conductive cover 10, the conductive cover 10 exhibits the electromagnetic shielding effect.

According to this embodiment, the active element 41 is also provided for the conductive cover 10 including the silicon substrate. The conductive cover 10 is effectively used as the substrate forming the active element 41. The conductive bonding members (12, 12a, and 12b) provided between the semiconductor substrate 14 and the conductive cover 10 are used as the bonding members between the semiconductor substrate 14 and the conductive cover 10, and each have a function as a wiring between the active element 40 provided for the semiconductor substrate and the active element 41 provided for the conductive cover 10.

In the manufacture of the semiconductor device 1 of this embodiment, for example, the conductive cover 10 is formed which includes the active element 41, the in-chip wirings (42a and 42b), the concave portion 11, the passivation film 26, and the conductive bonding members (12, 12a, and 12b) partially filling the openings (30, 30a, and 30b) of the passivation film 26. Similarly, the semiconductor substrate 14 is formed which includes the predetermined active element 40, the in-chip wirings (16a, 16b, and 16c), the passivation film 13, the conductive bonding members (12, 12a, and 12b), and the insulating bonding member 23 formed on the first main surface. The conductive cover 10 and the semiconductor substrate 14 are bonded to each other by thermal treatment. Next, the steps described with reference to FIG. 3C and the subsequent drawings are performed, thereby manufacturing the semiconductor device 1.

As the conductive cover 10, a metal cover such as a Cu cover can be used. Although the conductive cover 10 having the concave portion is described in the embodiment, a conductive cover with a flat structure on the semiconductor substrate side can be used alternatively. In this case, the thickness of the bonding member for bonding the conductive cover and the semiconductor substrate forms the hollow portion between the conductive cover and the surface of the semiconductor substrate. Further, the solder ball electrically connected to the conductive cover via the TSV is not limited to the connection to the ground potential but may be a fixed potential. For example, the structure of applying a power source voltage VDD may be employed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor substrate having a first main surface and a second main surface and including a predetermined element formed on the first main surface and a plurality of through silicon vias (TSVs) configured to electrically connect a plurality of wirings formed on the first main surface to a plurality of electrodes correspondingly formed on the second main surface;
   a conductive cover configured to cover the first main surface of the semiconductor substrate, the conductive cover being provided with a predetermined concave portion facing the first main surface of the semiconductor substrate; and
   a conductive bonding member configured to bond the conductive cover and one wiring of the wirings formed on the first main surface of the semiconductor substrate to each other.

2. The semiconductor device according to claim 1, wherein the bonding member surrounds a periphery on the first main surface of the semiconductor substrate and has a projection portion projecting inward from the periphery, and the projection portion of the bonding member extends over at least one of the TSVs provided for the semiconductor substrate.

3. The semiconductor device according to claim 2, wherein during an operation time, a fixed potential is applied to the electrode among the electrodes formed on the second main surface, the electrode being electrically connected to the wiring bonded to the conductive cover with the conductive bonding member.

4. The semiconductor device according to claim 3, wherein the electrode is applied with a ground potential as the fixed potential.

5. The semiconductor device according to claim 4, wherein the conductive cover includes a silicon substrate doped with a predetermined impurity.

6. The semiconductor device according to claim 4, wherein the conductive cover is made of metal.

7. The semiconductor device according to claim 1, wherein during an operation time, a ground potential is applied to the electrode among the electrodes formed on the second main surface, the electrode being electrically connected to the wiring bonded to the conductive cover with the conductive bonding member.

8. The semiconductor device according to claim 7, wherein the conductive cover includes a silicon substrate doped with a predetermined impurity.

9. A semiconductor device comprising:
   a semiconductor substrate having a first main surface and a second main surface and including a predetermined element formed on the first main surface and a plurality of through silicon vias (TSVs) configured to electrically connect a plurality of wirings formed on the first main surface to a plurality of electrodes correspondingly formed on the second main surface;
   a conductive cover configured to cover the first main surface of the semiconductor substrate, the conductive cover being provided with a predetermined concave portion facing the first main surface of the semiconductor substrate;

an insulating bonding member provided between the conductive cover and the first main surface of the semiconductor substrate and surrounding a periphery on the first main surface of the semiconductor substrate; and a conductive bonding member provided between the conductive cover and the wiring formed on the first main surface in a region surrounded by the insulating bonding member.

10. The semiconductor device according to claim 9, wherein the conductive bonding member is bonded to one wiring of the wirings formed on the first main surface.

11. The semiconductor device according to claim 10, wherein during an operation time, a ground potential is applied to the electrode among the electrodes formed on the second main surface, the electrode being electrically connected to the wiring bonded to the conductive cover with the conductive bonding member.

12. The semiconductor device according to claim 11, wherein the conductive cover includes a silicon substrate doped with a predetermined impurity.

13. The semiconductor device according to claim 12, wherein the conductive cover is provided with a predetermined active element.

14. The semiconductor device according to claim 13, wherein a plurality of conductive bonding members is provided between the wirings formed on the first main surface and the conductive cover, and the predetermined element formed on the first main surface of the semiconductor substrate and the predetermined active element provided for the conductive cover are electrically connected to each other via one of the plurality of conductive bonding members.

* * * * *